(12) United States Patent
Yang

(10) Patent No.: US 6,627,366 B2
(45) Date of Patent: Sep. 30, 2003

(54) ELECTRON BEAM EXPOSURE METHOD HAVING GOOD LINEARITY WITH RESPECT TO PRODUCING FINE PATTERNS

(75) Inventor: Seung-hune Yang, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 77 days.

(21) Appl. No.: 10/012,561

(22) Filed: Dec. 12, 2001

(65) Prior Publication Data

US 2002/0115020 A1 Aug. 22, 2002

(30) Foreign Application Priority Data

Dec. 27, 2000 (KR) ........................... 2000-82757

(51) Int. Cl.[7] ............... G03F 9/00; G03C 5/00
(52) U.S. Cl. ............ 430/30; 430/296; 430/942
(58) Field of Search ............ 430/30, 296, 942

(56) References Cited

U.S. PATENT DOCUMENTS 6,291,119 B2 * 9/2001 Choi et al. ............... 430/30
6,296,976 B1 * 10/2001 Groves et al. ............. 430/30

\* cited by examiner

*Primary Examiner*—Christopher G. Young
(74) *Attorney, Agent, or Firm*—Volentine Francos, PLLC

(57) ABSTRACT

A variable shaped beam exposure method and a pattern forming method using the same exhibit excellent linearity insofar as the variation in measured critical dimension from design critical dimension is concerned. First, the design critical dimension of one of a plurality of patterns that can be formed through the use of the variable shaped beam exposure method is determined. If the value of the critical dimension exceeds a predetermined value, the selected pattern is formed using a first exposure dose which has previously designated for this case. On the other hand, if the value of the critical dimension is less than the predetermined value, the selected pattern is formed using a second exposure dose that is equal to the first exposure dose plus a supplementary exposure dose.

29 Claims, 6 Drawing Sheets

ELECTRON BEAM EXPOSURE METHOD HAVING GOOD LINEARITY WITH RESPECT TO PRODUCING FINE PATTERNS

BACKGROUND OF THE INVENTION

1. Field of the Invention

The present invention relates to a method of manufacturing semiconductor devices. More particularly, the present invention relates to a method of exposing photoresists using an electron beam exposure apparatus having a variable beam-shaping system and to a method of forming patterns on semiconductor substrates using the same.

2. Description of the Related Art

As semiconductor devices become more highly integrated, the widths of patterns formed on a semiconductor substrate and the gap between adjacent patterns become smaller. Accordingly, exposure techniques for forming patterns on a semiconductor substrate are constantly being evaluated and refined. A conventional one of these exposure techniques is a reduction projection exposure method using ultraviolet light. However, this method is limited in its ability to form patterns having a minute design rule. Recently, though, an exposure technique using electron beams has been widely used for forming ultra-fine patterns on a semiconductor substrate.

One such exposure technique using electron beams is a beam-shaping exposure method. In this method, an electron beam produced by an electron gun is passed through a first rectangular aperture. The first aperture shapes the electron beam such that it too has a rectangular cross section. The rectangular electron beam is then deflected through a second element having an aperture. The second aperture is rectangular but its dimensions can be varied. As a result, the electron beam is shaped so as to have a predetermined cross section. Then, the cross section of the beam is further reduced by means of a reduction lens, whereupon the beam is directed onto a semiconductor substrate coated with a photoresist. In this method also, a desired pattern can formed on the semiconductor substrate by establishing the desired pattern as a plurality of shots, and then exposing the same number of areas of the photoresist as there are shots.

All exposure methods using electron beams, including the variable beam-shaping exposure method, are superior to the conventional reduction projection exposure method in terms of resolution and accuracy. However, recently-developed semiconductor devices have design critical dimensions (CD) of 0.3 μm or less, and exposure methods using electron beams still have problems forming patterns having such small critical dimensions. In particular, as the design critical dimension decreases, the linearity of the variable beam-shaping exposure method deteriorates. Here, the term "linearity" refers to the tendency of the difference between a measured (actual) critical dimension and the design critical dimension to remain constant as the design critical dimension changes. That is, if the difference between the measured critical dimension and the design critical dimension remains uniform irrespective of changes in the design critical dimension, the linearity is considered to be good. However, the linearity of a conventional exposure method using an electron beam is unsatisfactory when the design critical dimension is in the range of 0.3 μm.

SUMMARY OF THE INVENTION

A first object of the present invention is to solve the above-described problems of the prior art by providing an electron beam exposure method having superior linearity with respect to the forming of patterns having fine design critical dimensions.

Similarly, a second object of the present invention is to provide a pattern forming method having superior linearity with respect to the forming of patterns having fine design critical dimensions.

To achieve the these objects, the present invention provides a method in which the exposure dose is selected based on the critical dimension of the pattern that is selected from among the various patterns that can be formed on the substrate.

In the electron beam exposure method, the design critical dimension (CD) of the selected pattern is determined. Next, the value of the design CD is compared to a predetermined CD value. The exposure process is performed using a first exposure dose of an electron beam, if the value of the design CD value exceeds the predetermined CD value. On the other hand, the exposure process is performed using a second exposure dose of the electron beam—equal to the first exposure dose plus a supplementary exposure dose—if the value of the design CD is less than the predetermined CD value. The predetermined CD is the one at which the linearity of the exposure process would begin to deteriorate if only performed for the patterns using the first exposure dose.

The supplementary exposure dose may have a value of ΔCORRECT expressed by the following equation:

$$\Delta CORRECT = \frac{\text{design CD value} - g(x_{CD})}{f(x_{CD})}$$

Here, $f(x_{CD})$ represents the variation of the measured CD in the case of forming patterns having the design CD using various exposure doses, respectively, of an electron beam having a certain acceleration voltage, and $g(x_{CD})$ represents the measured CD in the case of forming the pattern having the design CD using the first exposure dose of the electron beam. The variable $f(x_{CD})$ may be a constant or a function of the variation of the measured CD according to changes in exposure dose. The variable $g(x_{CD})$ may also be a constant or a function.

The supplementary exposure dose may have a value that is inversely proportional to the density of patterns located within a predetermined distance from the selected pattern. In this case, the supplementary exposure dose has a value of ΔCORRECT*$R_C$ expressed by the following equation:

$$\Delta CORRECT * R_c = \frac{\text{design CD value} - g(x_{CD})}{f(x_{CD})} \times R_c$$

Here, $f(R_C)$ is a weight corresponding to the density of patterns disposed within the predetermined distance from where the selected pattern is to be formed, and $0 < R_C \leq 1$.

In a typical application, various ones of the patterns are formed on the semiconductor substrate. The patterns may all be rectangular. In this case, the design CD is determined based on the minimum dimension of the selected pattern. Some of the patterns will have a design CD smaller than the predetermined CD, and so the method will entail forming patterns on the substrate using various doses of the electron beam, respectively. The variations in the dose of the electron beam can be provided by keeping the same acceleration voltage but varying the exposure time.

In the pattern forming method of the present invention, a photoresist film is formed on a substrate. A target area on the photoresist film having a design CD is exposed using a first exposure dose of a shaped electron beam if the value of the design CD is greater than a predetermined value. On the other hand, if the value of the design CD is less than the predetermined value, the target area is exposed using a second exposure dose of a shaped electron beam, the second exposure dose being equal to the first exposure dose plus a supplementary exposure dose. Finally, the exposed photoresist film is developed to form a photoresist pattern.

As was previously described, the supplemental exposure dose may have a value of ΔCORRECT or ΔCORRECT*$R_C$.

The substrate may be a transparent substrate. In this case, a phase shift layer and a light shielding layer are formed on the transparent substrate before the photoresist film is formed. Alternatively, the substrate may be a semiconductor wafer.

In the present invention, even when the design CD of a pattern is rather small, the pattern may be formed satisfactorily using an electron beam because the exposure dose by which the pattern is formed includes a supplemental amount designed to overcome those inherent characteristics of the electron beam exposure process which otherwise make forming very fine patterns difficult.

BRIEF DESCRIPTION OF THE DRAWINGS

The above and other objects, features and advantages of the present invention will become more apparent by referring to the following detailed description of the preferred embodiments thereof made with reference to the attached drawings, of which.

DETAILED DESCRIPTION OF THE PREFERRED EMBODIMENTS

Figure 1:
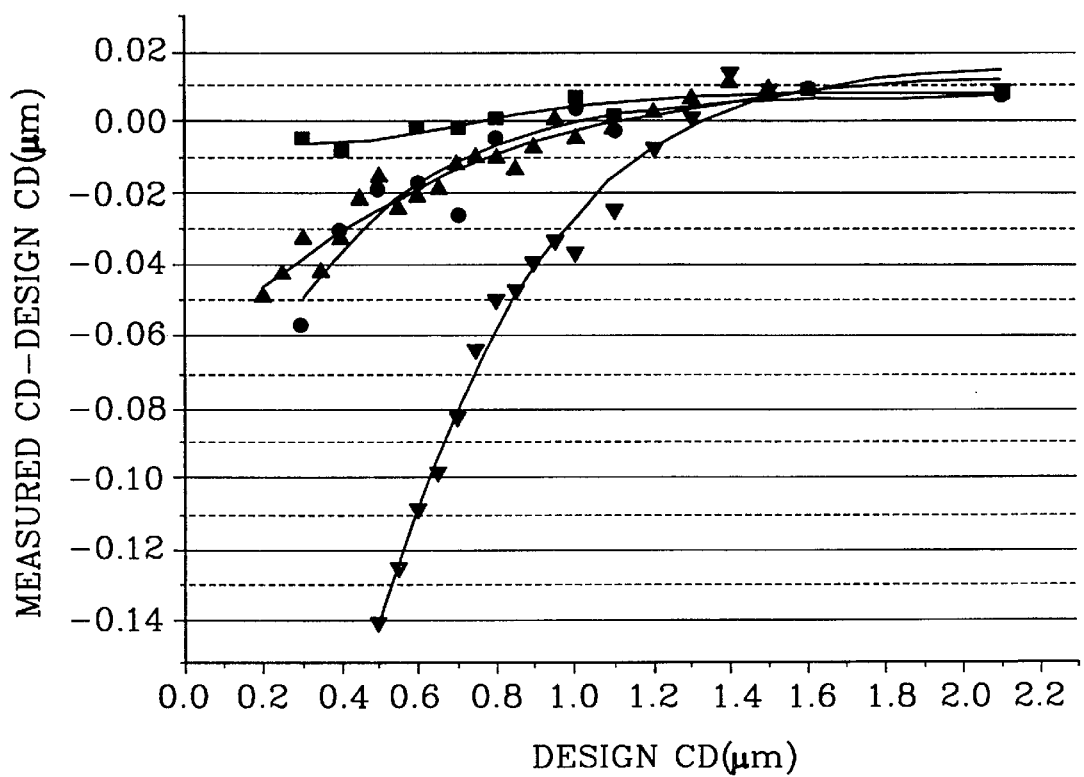
FIG. 1 is a graph showing the dependence of linearity on the acceleration voltage of an exposure apparatus.

The present invention now will be described more fully with reference to the accompanying drawings. In the drawings, the thickness of layers and regions are exaggerated for the sake of clarity. It will also be understood that when a layer is described to as being "on" another layer or substrate, such a description means that the layer can be disposed directly on the other layer or substrate, or that intervening layers may be interposed therebetween. Also, the term "forming a pattern" is used at times to describe the mere act of exposing a photoresist to a pattern of light, i.e., a cross-sectional shape of an electron beam, whereupon the light sensitive component of the photoresist is activated in the exposed region of the photoresist.

FIG. 1 shows the results of a study on the dependence of linearity on the acceleration voltage of an exposure apparatus. In this study, line patterns (■) and contact patterns (●) having a variety of design CD values were formed using an electron beam exposure apparatus having a vector scanning system and an acceleration voltage of 50 keV. Line patterns (▲) and contact patterns (▼) having a variety of design CD values were formed using an electron beam exposure apparatus having a raster scanning system and an acceleration voltage of 10 keV. The results show that the linearity is better when using an exposure apparatus having a relatively high acceleration voltage. However, the linearity of a method using an exposure apparatus having a relatively high acceleration voltage still needs to be improved when the design CD is low.

Figure 2:
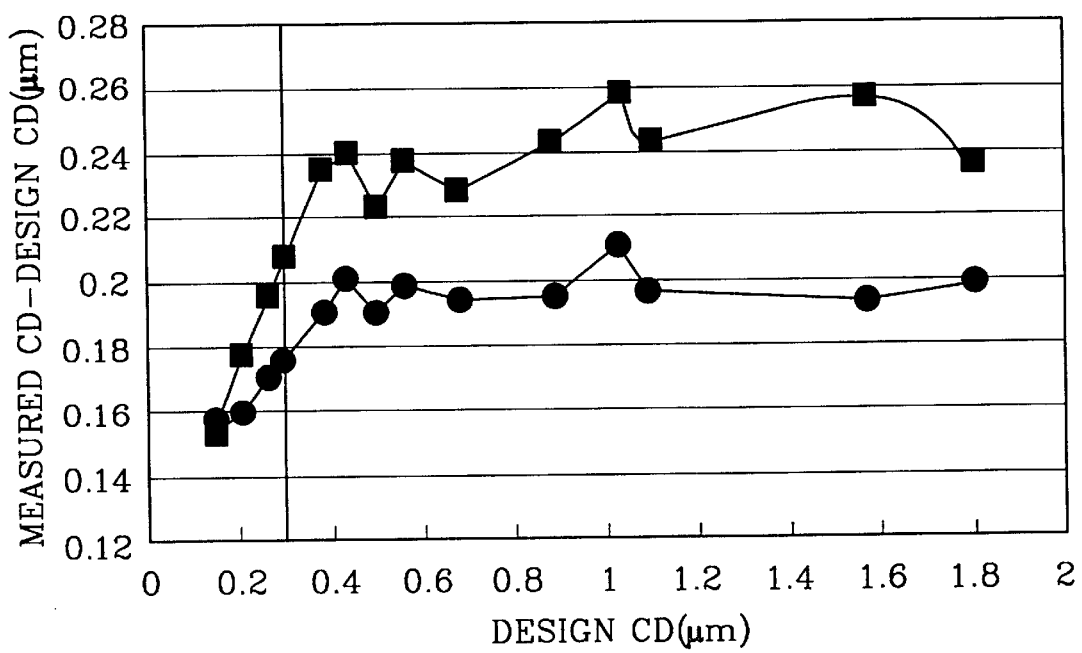
FIG. 2 is a graph showing the linearity of methods of exposing two different kinds of photoresist films.

FIG. 2 shows the results of a study on the dependence of linearity on the type of photoresist film that is to be exposed. In this study, two different resists, namely sample 1 (●) and sample 2 (■), were exposed using the same electron beam exposure method. As the results show, the linearity in either case is poor once the value of the design CD is less than a certain value.

Next, the linearity of a method of forming patterns using a variable shaped beam (VSB) exposure apparatus will be described in more detail.

Figure 3A:
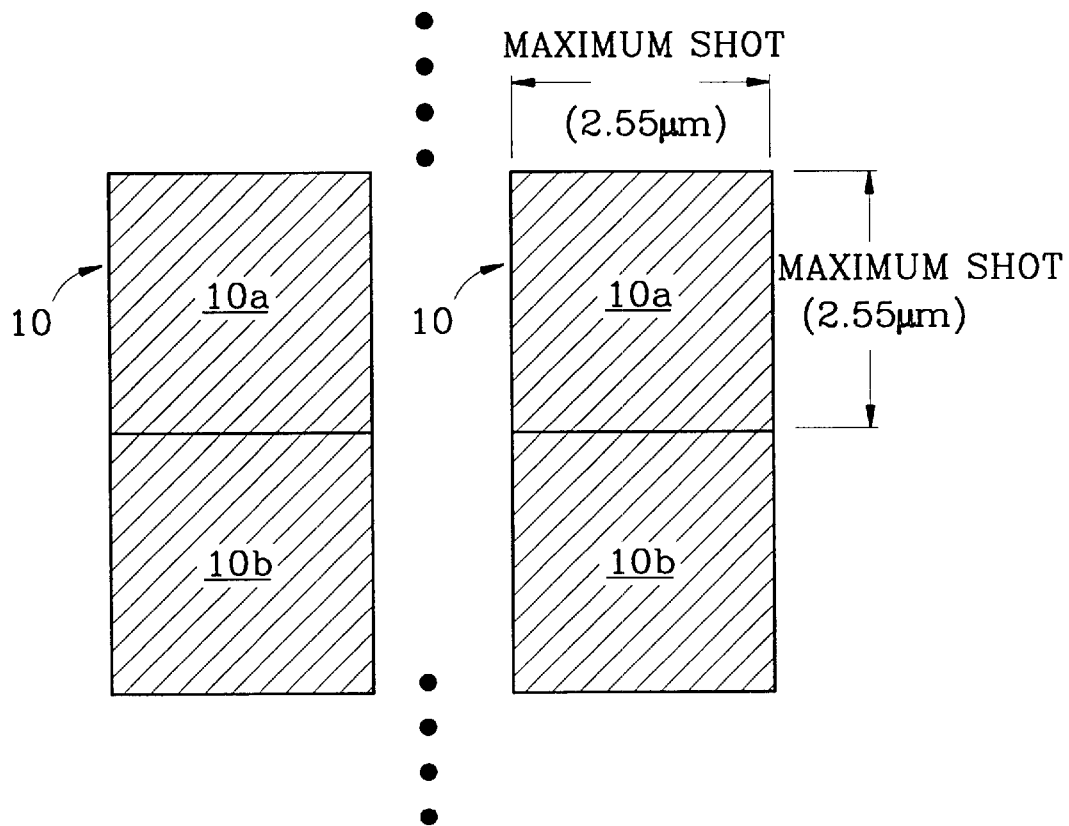
FIGS. 3A and 3B are conceptual diagrams illustrating a method of forming patterns having different design critical dimensions.
Figure 3B:
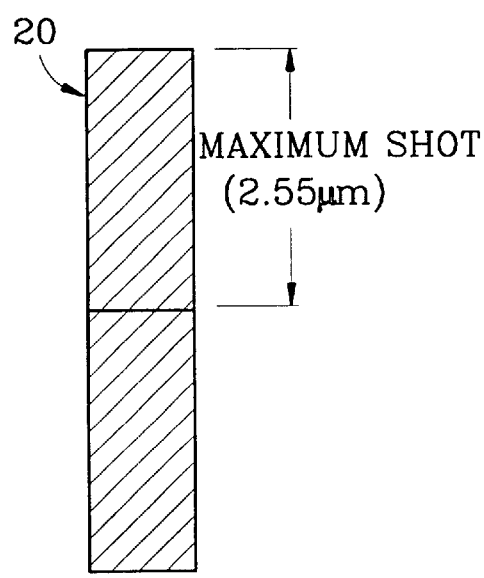

As was mentioned earlier, a variable shaped beam (VSB) exposure apparatus can shape an electron beam so that the beam will be suitable for forming various patterns. In the case of forming patterns 10 that have the maximum CDs, e.g., relatively large line widths, as illustrated in FIG. 3A, the desired patterns are established as a plurality of shots (10a, 10b and so on) each having the maximum dimensions, i.e., 2.55 μm×2.55 μm. Next, the exposure process is repeated a number of times corresponding to the number of shots to form the patterns 10. Because the dimensions of the shots are relatively large, the measured dimensions of the patterns 10 are close to the design CD. On the other hand, in the case of forming a pattern 20 as shown in FIG. 3, the dimension of a shot in the vertical direction is the same as the maximum dimension, but the dimension of the shot in the horizontal direction is less than the value at which the linearity becomes poor. That is, in the case of forming the pattern shown in FIG. 3, there is a relatively large discrepancy between the measured CD and the design CD in the horizontal direction.

The present invention serves to improve the linearity of the use of a variable shaped beam (VSB) exposure apparatus, i.e., to reduce the discrepancies between the design CDs and the measured (actual) CDs even when the design CDs are relatively small.

Figure 4:
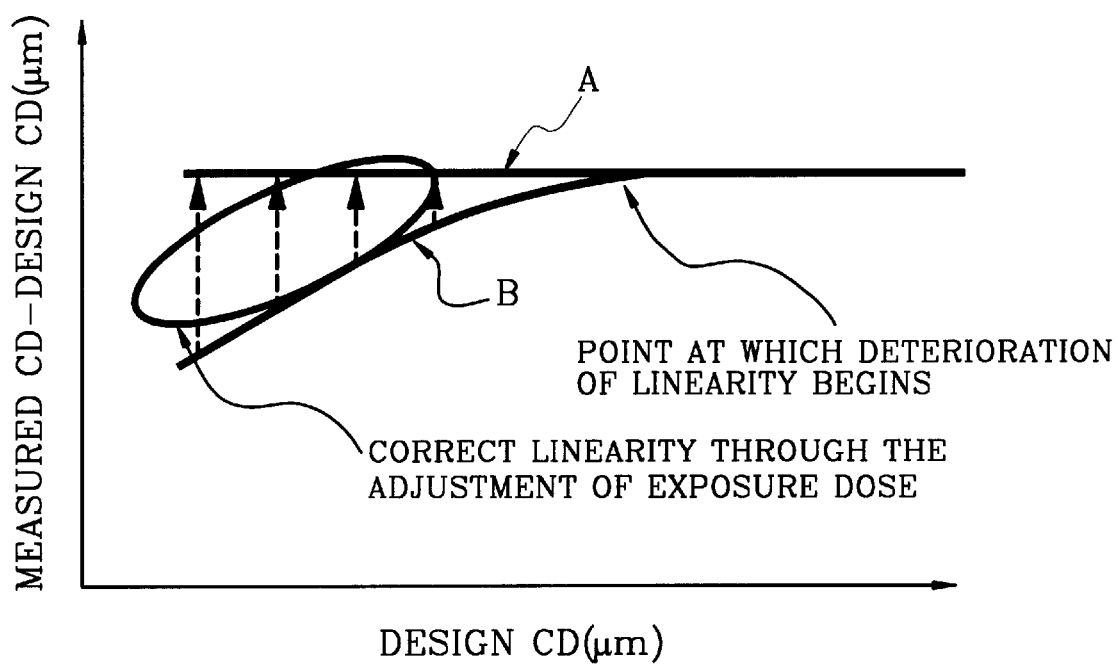
FIG. 4 is a graph illustrating the improvement offered by an electron beam exposure method according to the present invention.

FIG. 4 illustrates the basic concepts behind improving the linearity of an electron beam exposure method according to the present invention. Plot "B" in FIG. 4 shows a conventional method having a linearity that deteriorates once the value of the CD becomes smaller than a certain value.

On the other hand, in the present invention, the exposure dose is adjusted based on the design CD in such a way that the process will exhibit a linearity shown by plot "A" in FIG. 4, namely one that is "good" even when forming patterns having CDs that are less than the CD at which the linearity starts to deteriorate when using the conventional method. Thus, the present invention lends itself well to an exposure apparatus employing a variable shaped beam exposure system.

Figure 5:
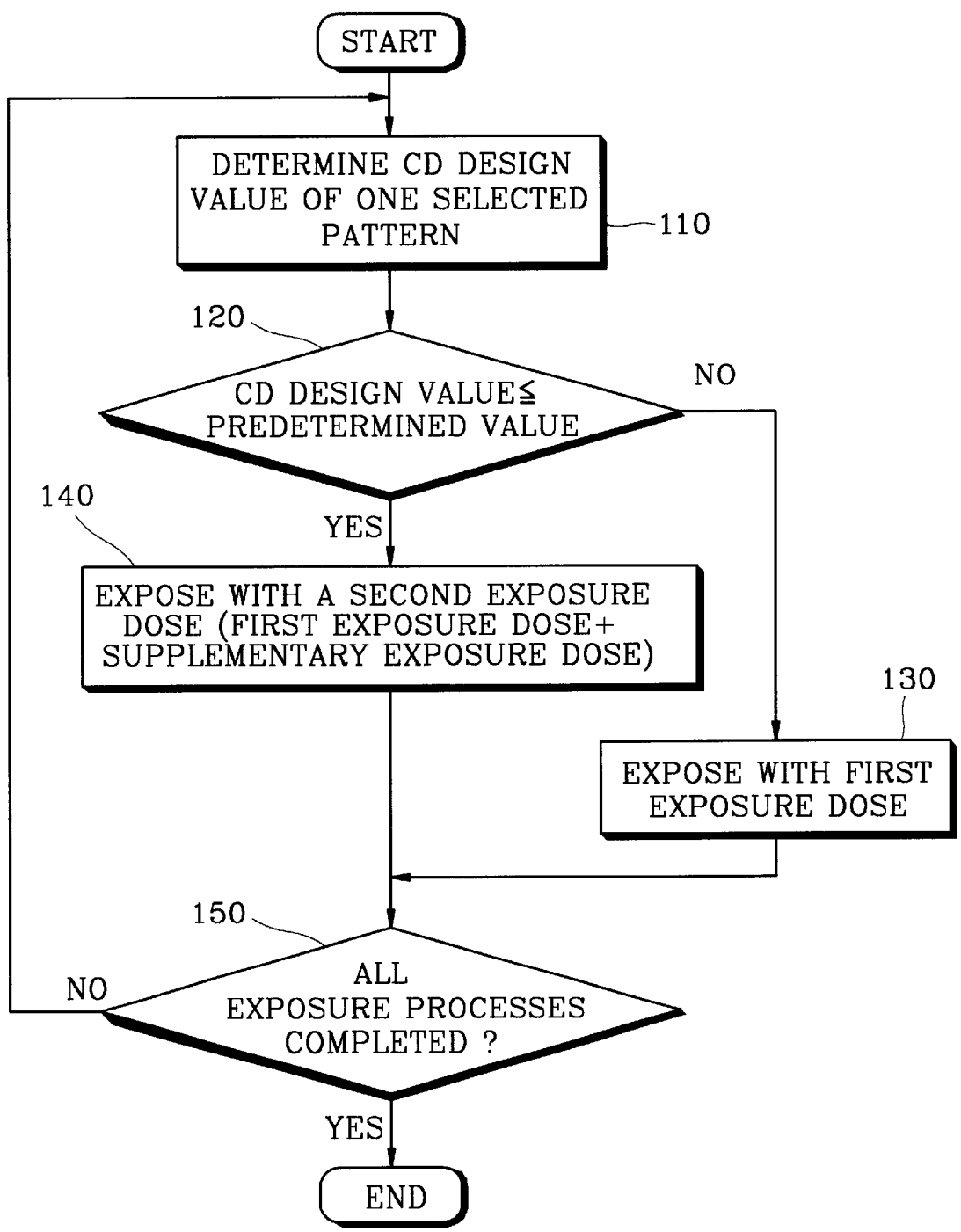
FIG. 5 is a flow chart of an electron beam exposure method according to a the present invention.

Referring now to FIG. 5, the method of the present invention entails using an electron beam exposure apparatus, that can form a plurality of patterns of different sizes and/or shapes, to form one or more of a plurality of the patterns. In step 110, a desired pattern(s) is selected, and the design CD value of the selected pattern(s) is/are determined. For example, the desired patterns may be rectangular. In this case, the design CD value is determined in correspondence with the minimum width and length of all of the desired patterns.

In step 120, the value of the design CD is compare with a predetermined value. If the design CD value exceeds the predetermined value, the pattern(s) is formed using a first exposure dose (dosage level of the electron beam), in step 130. The first exposure dose is determined in advance for use in any case in which the design CD value of a selected pattern exceeds the predetermined value. The predetermined value is also formulated in advance but according to the types of patterns that can be formed by the apparatus, or on the basis of experience or on the basis of data obtained through experiments.

On the contrary, if the value of the design CD value is determined to be less than the predetermined value in step 120, the pattern is formed using a second exposure dose that is equal to the sum of the first exposure dose and a supplementary exposure dose, in step 140.

In step 150, it is determined as to whether all of the exposure processes necessary for forming all of the desired patterns on the substrate have been completed. If not, the process steps 110, 120 and 130 or 140 are repeated, i.e., the next exposure process is performed.

The exposure processes represented by steps 130 and 140 are performed with electron beams having the same acceleration voltage. The differences in the first and second exposure doses are provided by selecting appropriate exposure times. In other words, the longer the exposure time, the greater the exposure dose.

In step 140, the supplementary exposure dose may have a value, ΔCORRECT, expressed by the following Equation (1):

$$\Delta CORRECT = \frac{\text{design CD value} - g(x_{CD})}{f(x_{CD})} \quad (1)$$

In Equation (1), $f(x_{CD})$ represents the variation of the measured CD in the case of forming patterns having the design CD using various exposure doses, respectively, of an electron beam having a certain acceleration voltage. The variable $f(x_{CD})$ may be a constant or may be a function of the variation of the measured CD value of the selected pattern from the design CD value according to various exposure doses. In Equation (1), $g(x_{CD})$ refers to the value of a measured CD of the pattern formed using the first exposure dose. The variable $g(x_{CD})$ may be a constant or a function which is formulated through a number of experiments.

The supplementary exposure dose can be determined taking into account the influence of patterns formed adjacent to where the selected pattern is to be formed. For example, the density of patterns formed within a distance of 5 μm from the location where the selected pattern is to be formed is taken into account when determining the supplementary exposure dose. At this time, a weight $R_C$, that is inversely proportional to the density of the patterns formed within a predetermined distance from where the selected pattern will be formed, can be added to the supplementary exposure dose. Such a scaled supplementary exposure dose (ΔCORRECT*$R_C$) may be expressed by the following Equation (2):

$$\Delta CORRECT * R_c = \frac{\text{design CD value} - g(x_{CD})}{f(x_{CD})} \times R_c \quad (2)$$

In Equation (2), 0<$R_C$≦1, and $f(x_{CD})$ and $g(x_{CD})$ are the same as those defined in connection with Equation (1).

Figure 6A:
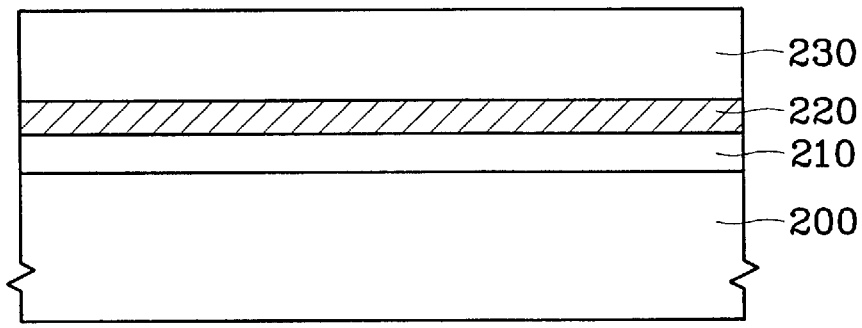
FIGS. 6A through 6C are cross sectional views of a semiconductor substrate and illustrate a method of forming a pattern according to the present invention.
Figure 6B:
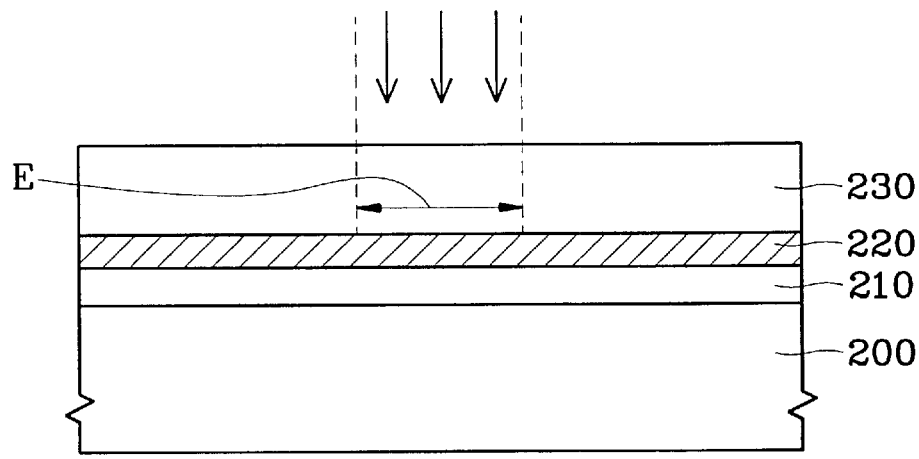
Figure 6C:
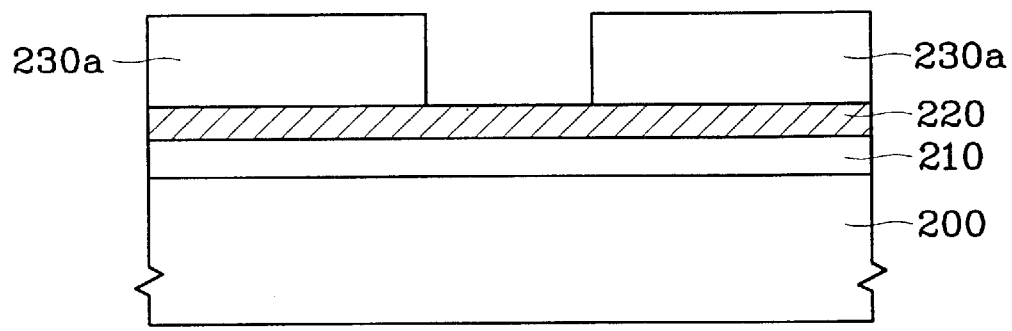

FIGS. 6A through 6C illustrate an actual forming of a pattern on a semiconductor substrate according to the present invention. In this embodiment, a photoresist pattern is formed to provide a light shield on a masked substrate. The present invention, however, can be applied to a method of forming a photoresist pattern for use as a mask that is, in turn, used to form a predetermined pattern directly on a wafer.

Referring to FIG. 6A, a phase shift layer 210 made of MoSiON is formed on a transparent substrate 200 made of glass or quartz. Next, a light shielding layer 220 that is to be patterned is formed on the phase shift layer 210. Note, the light shielding layer 220 may be first formed on the substrate and then the phase shift layer 210 is formed on the light shielding layer 220. Next, a photoresist film 230 is formed on the light shielding layer 220. The photoresist film 230 can be a positive type or a negative type of resist. In this embodiment, the photoresist film 230 is a positive type of resist.

Referring to FIG. 6B, a certain area (E) of the photoresist film 230 is exposed using a variable shaped beam exposure method. The design CD of area (E) is determined based on the dimensions of the light shielding layer pattern to be formed. If the value of the design CD of area (E) exceeds a predetermined value, the area is exposed using a first exposure dose of an electron beam. On the other hand, if the value of the design CD is less than the predetermined value, the area (E) is exposed with a second exposure dose which equals the first exposure dose plus a supplementary exposure dose. The supplementary exposure dose can be determined in the same way as described previously with reference to FIG. 5.

Referring to FIG. 6C, the exposed photoresist film 230 is developed, and then a photoresist pattern 230a is formed.

The electron beam exposure method according to the present invention exhibits better linearity than a conventional method and can be performed using existing apparatus such as a variable shaped beam (VSB) apparatus. Thus, desired patterns, especially, patterns having a fine design CD can be readily formed.

Finally, although the present invention has been shown and described with reference to the preferred embodiments thereof, various changes in form and details, as will become apparent to those of ordinary skill in the art, may be made thereto without departing from the true spirit and scope of the invention as defined by the appended claims.

What is claimed is:

1. An electron beam exposure method comprising the steps of:

selecting a desired pattern from among a plurality of patterns having different dimensions and which patterns can be formed on a semiconductor substrate using a variable shaped beam (VSB) exposure apparatus, and determining a design critical dimension (CD) of the selected pattern;

comparing the value of the design CD to a predetermined CD value;

if the value of the design CD is greater than said predetermined value, operating the variable shaped beam (VSB) exposure apparatus to expose a resist on the substrate with a first exposure dose of its electron beam; and if the value of the design CD is less than said predetermined value, operating the variable shaped beam (VSB) exposure apparatus to expose the resist with a second exposure dose of the electron beam, the second exposure dose being equal to the sum of said first exposure dose plus a supplementary exposure dose.

2. The electron beam exposure method of claim 1, wherein the supplementary exposure dose has a value of ΔCORRECT satisfying the following equation, $$\Delta CORRECT = \frac{\text{design CD value} - g(x_{CD})}{f(x_{CD})}$$

wherein $f(x_{CD})$ represents the variation of the measured CD in the case of forming patterns having the design CD using various exposure doses, respectively, of the electron beam having a certain acceleration voltage, and $g(x_{CD})$ is the measured value of a CD of the selected pattern formed on the substrate by the variable shaped beam (VSB) exposure apparatus using said first exposure dose.

3. The electron beam exposure method of claim 2, wherein $f(x_{CD})$ is a constant.

4. The electron beam exposure method of claim 2, wherein $f(x_{CD})$ is a function of the variation of the measured CD from its design CD according to changes in the exposure dose of the electron beam at said certain acceleration voltage.

5. The electron beam exposure method of claim 2, wherein $g(x_{CD})$ is a constant.

6. The electron beam exposure method of claim 1, and further comprising quantifying the density of patterns disposed within a predetermined distance from where the resist is to be exposed, and wherein the operating of the variable shaped beam exposure apparatus when the design CD value is less than the predetermined CD value comprises exposing the resist with a second exposure dose of light equal to the sum of said first exposure dose plus a supplementary exposure dose that has a value which is inversely proportional to said density of patterns.

7. The electron beam exposure method of claim 6, wherein the supplementary exposure dose has a weighted value of ΔCORRECT*$R_C$, satisfying the following equation, $$\Delta CORRECT * R_c = \frac{\text{design CD value} - g(x_{CD})}{f(x_{CD})} \times R_c$$

wherein $f(x_{CD})$ represents the variation of the measured CD in the case of forming patterns having the design CD using various exposure doses, respectively, of an electron beam at the same acceleration voltage, $g(x_{CD})$ is the measured value of a CD of the selected pattern when formed on the substrate by the variable shaped beam (VSB) exposure apparatus using said first exposure dose, ($R_C$) is a weight corresponding to said density of patterns disposed within said predetermined distance from where the selected pattern is to be formed, and 0<($R_C$)≦1.

8. The electron beam exposure method of claim 7, wherein the predetermined distance is 5 μm.

9. The electron beam exposure method of claim 1, wherein the resist is exposed with an exposure dose of an electron beam having the same acceleration voltage irrespective of whether the value of the design CD is greater or less than said predetermined CD value.

10. The electron beam exposure method of claim 1, wherein the steps of operating the variable shaped electron beam apparatus comprise selecting the exposure time to provide either of the first and second exposure doses.

11. The electron beam exposure method of claim 1, wherein said plurality of patterns are rectangular, and the design CD is determined based upon the smallest dimension of the selected pattern.

12. A pattern forming method comprising the steps of:
forming a photoresist film on a substrate;
determining a design CD for a target area of the photoresist film;
comparing the value of the design CD to a predetermined CD value;
if the value of the design CD exceeds said predetermined CD value, exposing the target area of the photoresist film with a first exposure dose of a shaped electron beam;
if the value of the CD is less than said predetermined value, exposing the target area with a second exposure dose of a shaped electron beam, the second exposure dose being equal to the sum of said first exposure dose plus a supplementary exposure dose; and
developing the exposed photoresist film to form a photoresist pattern.

13. The pattern forming method of claim 12, wherein the substrate is a transparent substrate, and further comprising forming a phase shift layer and a light shielding layer on the transparent substrate before the photoresist film is formed.

14. The pattern forming method of claim 12, wherein the supplementary exposure dose has a value of ΔCORRECT satisfying the following equation, $$\Delta CORRECT = \frac{\text{design CD value} - g(x_{CD})}{f(x_{CD})}$$

$f(x_{CD})$ represents the variation of the measured CD in the case of forming patterns on the photoresist film having the design CD using various exposure doses, respectively, of an electron beam having a certain acceleration voltage, and $g(x_{CD})$ is the measured value of a CD of the pattern when formed on the photoresist film using said first exposure dose.

15. The pattern forming method of claim 12, and further comprising quantifying the density of patterns disposed within a predetermined distance from the target area, and wherein the exposing of the target area when the design CD value is less than the predetermined CD value comprises forming the pattern on the photoresist film with a second exposure dose equal to the sum of said first exposure dose plus a supplementary exposure dose that has a value which is inversely proportional to said density of patterns.

16. The pattern forming method of claim 15, wherein the supplementary exposure dose has a weighted value of ΔCORRECT*$R_C$, satisfying the following equation, $$\Delta CORRECT * R_c = \frac{\text{design CD value} - g(x_{CD})}{f(x_{CD})} \times R_c$$

wherein $f(x_{CD})$ represents the variation of the measured CD in the case of forming patterns on the photoresist film having the design CD using various exposure doses, respectively, of an electron beam having a certain acceleration voltage, $g(x_{CD})$ is the measured value of a CD of the pattern when formed on the photoresist film by the variable shaped beam (VSB) exposure apparatus using said first exposure dose, ($R_C$) is a weight corresponding to said density of patterns disposed within a predetermined distance from the target area, and $0<(R_C)\leq 1$.

17. The pattern forming method of claim 12, wherein the pattern is formed on the photoresist film with an exposure dose of a shaped electron beam having the same acceleration voltage irrespective of whether the value of the design CD is greater or less than said predetermined CD value.

18. The pattern forming method of claim 12, wherein the exposing steps comprise selecting the exposure time to provide either of the first and second exposure doses.

19. An electron beam exposure method comprising the steps of:
(a) selecting a pattern from among a plurality of patterns having different dimensions and which patterns are to be formed on a semiconductor substrate using a variable shaped beam (VSB) exposure apparatus, and determining a design critical dimension (CD) of the selected pattern;
(b) formulating a predetermined CD value, wherein the value of the design CD of at least one of said patterns is less than the predetermined CD value;
(c) comparing the value of the design CD of the selected pattern to the predetermined CD value;
(d) if the value of the design CD of the selected pattern is greater than said predetermined value, operating the variable shaped beam (VSB) exposure apparatus to expose a resist on the substrate with a first exposure dose of the electron beam produced by the apparatus;
(e) if the value of the design CD of the selected pattern is less than the predetermined CD value, operating the variable shaped beam (VSB) exposure apparatus to expose a resist on the substrate with a second exposure dose of the electron beam, the second exposure dose being equal to said first exposure dose plus a supplementary exposure dose;
(f) repeating steps (a) and (c)–(e) until all of the plurality of patterns have been selected and all of the patterns have been formed on the resist.

20. The electron beam exposure method of claim 19, wherein the supplementary exposure dose has a value of ΔCORRECT satisfying the following equation, $$\Delta CORRECT = \frac{\text{design CD value} - g(x_{CD})}{f(x_{CD})}$$

wherein $f(x_{CD})$ represents the variation of the measured CD in the case of forming patterns having the design CD using various exposure doses, respectively, of an electron beam having a certain acceleration voltage, and $g(x_{CD})$ is the measured value of a CD of the selected pattern formed on a substrate by the variable shaped beam (VSB) exposure apparatus using said first exposure dose.

21. The electron beam exposure method of claim 20, wherein $f(x_{CD})$ is a constant.

22. The electron beam exposure method of claim 20, wherein $f(x_{CD})$ is a function of the variation of the measured CD value from its design CD according to changes in the exposure dose of the electron beam having said certain acceleration voltage.

23. The electron beam exposure method of claim 20, wherein $g(x_{CD})$ is a constant.

24. The electron beam exposure method of claim 19, and further comprising quantifying the density of patterns disposed within a predetermined distance from where the exposure is to take place according to step (d) or step (e), and wherein the operating of the variable shaped beam exposure apparatus when the design CD value is less than the predetermined CD value comprises exposing the resist with a second exposure dose equal to the sum of said first exposure dose plus a supplementary exposure dose that has a value which is inversely proportional to said density of patterns.

25. The electron beam exposure method of claim 24, wherein the supplementary exposure dose has a weighted value of $\Delta CORRECT*R_C$, satisfying the following equation, $$\Delta CORRECT*R_c = \frac{\text{design CD value} - g(x_{CD})}{f(x_{CD})} \times R_c$$

wherein $f(x_{CD})$ represents a variation of the measured CD value from the value of the design CD of the selected pattern when formed on the substrate with an electron beam having a certain acceleration voltage, $g(x_{CD})$ is the measured value of a CD of the selected pattern when formed on the substrate by the variable shaped beam (VSB) exposure apparatus using said first exposure dose, ($R_C$) is a weight corresponding to said density of patterns disposed within a predetermined distance from where the selected pattern is to be formed, and $0<(R_C)\leq 1$.

26. The electron beam exposure method of claim 25, wherein the predetermined distance is 5 μm.

27. The electron beam exposure method of claim 19, wherein the resist is exposed with an exposure dose of an electron beam having the same acceleration voltage irrespective of whether the value of the design CD is greater or less than said predetermined CD value.

28. The electron beam exposure method of claim 19, wherein the steps of operating the variable shaped electron beam apparatus comprise selecting different exposure times to provide the exposure doses, respectively.

29. The electron beam exposure method of claim 19, wherein said plurality of patterns are rectangular, and the design CD is determined based upon the smallest dimension of the selected pattern.

* * * * *